US011339258B2

(12) United States Patent
Liao et al.

(10) Patent No.: US 11,339,258 B2
(45) Date of Patent: May 24, 2022

(54) RESIN COMPOSITION, AND PRE-PREG, METAL-CLAD LAMINATE AND PRINTED CIRCUIT BOARD PREPARED USING THE SAME

(71) Applicant: TAIWAN UNION TECHNOLOGY CORPORATION, Chupei (TW)

(72) Inventors: Chih-Wei Liao, Chupei (TW); Guan-Syun Tseng, Chupei (TW); Tsung-Hsien Lin, Chupei (TW); Ju-Ming Huang, Chupei (TW); Chen-Hua Yu, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 325 days.

(21) Appl. No.: 16/009,266

(22) Filed: Jun. 15, 2018

(65) Prior Publication Data
US 2019/0203003 A1 Jul. 4, 2019

(30) Foreign Application Priority Data

Jan. 3, 2018 (TW) ................................ 107100199

(51) Int. Cl.
*C08J 5/24* (2006.01)
*C09D 163/00* (2006.01)
*C09D 5/18* (2006.01)
*B32B 15/092* (2006.01)
*H05K 1/03* (2006.01)
(Continued)

(52) U.S. Cl.
CPC ............... *C08J 5/24* (2013.01); *B32B 15/092* (2013.01); *C08L 63/00* (2013.01); *C09D 5/18* (2013.01); *C09D 163/00* (2013.01); *H05K 1/024* (2013.01); *H05K 1/0366* (2013.01); *H05K 1/0373* (2013.01); *H05K 3/022* (2013.01); *B32B 15/08* (2013.01); *B32B 15/098* (2013.01); *B32B 15/14* (2013.01); *B32B 2311/00* (2013.01); *B32B 2361/00* (2013.01); *B32B 2363/00* (2013.01); *B32B 2457/08* (2013.01); *C08G 8/04* (2013.01); *C08G 8/12* (2013.01); *C08G 59/40* (2013.01); *C08G 59/4014* (2013.01); *C08G 59/4064* (2013.01); *C08J 5/241* (2021.05); *C08J 5/249* (2021.05); *C08J 7/04* (2013.01); *C08J 2363/00* (2013.01); *C08J 2421/00* (2013.01); *C08J 2461/00* (2013.01); *C08J 2461/04* (2013.01); *C08J 2461/06* (2013.01); *C08J 2461/10* (2013.01); *C08J 2465/02* (2013.01); *C08K 3/013* (2018.01); *C08K 5/0025* (2013.01); *C08K 5/0066* (2013.01); *C08K 5/49* (2013.01); *C08K 5/51* (2013.01); *C08K 5/53* (2013.01); *C08K 5/5313* (2013.01); *C08L 61/04* (2013.01); *C08L 61/06* (2013.01); *C08L 2201/02* (2013.01); *C08L 2201/08* (2013.01); *C08L 2203/20* (2013.01); *C08L 2205/025* (2013.01); *C08L 2205/03* (2013.01); *C08L 2205/035* (2013.01); *C08L 2205/05* (2013.01); *C08L 2205/14* (2013.01); *C08L 2207/53* (2013.01); *C09D 161/04* (2013.01); *C09D 161/06* (2013.01); *H05K 1/03* (2013.01); *H05K 1/036* (2013.01); *H05K 2201/012* (2013.01); *H05K 2201/0212* (2013.01); *H05K 2201/0227* (2013.01); *Y10T 428/31511* (2015.04); *Y10T 428/31515* (2015.04); *Y10T 428/31518* (2015.04); *Y10T 428/31522* (2015.04); *Y10T 428/31525* (2015.04); *Y10T 428/31529* (2015.04); *Y10T 428/31688* (2015.04); *Y10T 428/31942* (2015.04)

(58) Field of Classification Search
None
See application file for complete search history.

(56) References Cited

U.S. PATENT DOCUMENTS

| 6,613,848 B1 * | 9/2003 | Wang .................... C07F 9/3282 |
| | | 525/481 |
| 8,124,716 B2 | 2/2012 | Gan |

(Continued)

FOREIGN PATENT DOCUMENTS

| CN | 103450263 A | * 12/2013 |
| CN | 103450264 A | * 12/2013 |

(Continued)

OTHER PUBLICATIONS

TW 2008-17469 A (Chung) (published Apr. 16, 2008) full English translation (2008). (Year: 2008).*

(Continued)

*Primary Examiner* — Vivian Chen
(74) *Attorney, Agent, or Firm* — Michael W. Ferrell; Ferrells, PLLC; Anna L. Kinney

(57) ABSTRACT

A resin composition is provided. The resin composition comprises the following components:
(A) a halogen-free epoxy resin;
(B) a hardener; and
(C) a phosphorus-containing phenolic resin of the following formula (I):

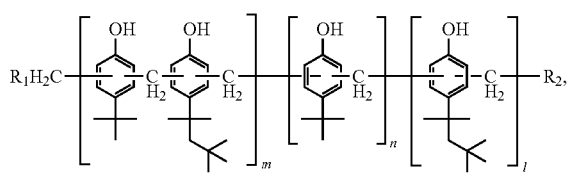

formula (I)

wherein m, n, l, $R_1$, and $R_2$ are as defined in the specification.

17 Claims, No Drawings

(51) Int. Cl.
*H05K 1/02* (2006.01)
*H05K 3/02* (2006.01)
*C08L 63/00* (2006.01)
*B32B 15/08* (2006.01)
*B32B 15/098* (2006.01)
*B32B 15/14* (2006.01)
*C08G 8/04* (2006.01)
*C08G 59/40* (2006.01)
*C08G 8/12* (2006.01)
*C08J 7/04* (2020.01)
*C08L 61/04* (2006.01)
*C08L 61/06* (2006.01)
*C08K 5/00* (2006.01)
*C08K 5/51* (2006.01)
*C08K 5/53* (2006.01)
*C08K 3/013* (2018.01)
*C08K 5/49* (2006.01)
*C08K 5/5313* (2006.01)
*C09D 161/04* (2006.01)
*C09D 161/06* (2006.01)

(56) References Cited

U.S. PATENT DOCUMENTS

| | | | | |
|---|---|---|---|---|
| 8,703,986 | B1* | 4/2014 | Lee | C07F 9/65719 558/82 |
| 2007/0221890 | A1* | 9/2007 | Gan | C08K 5/5313 252/601 |
| 2009/0298970 | A1 | 12/2009 | Attarwala et al. | |
| 2010/0261837 | A1* | 10/2010 | Gan | C08G 59/4014 524/590 |
| 2010/0294429 | A1* | 11/2010 | Hoevel | C08G 59/304 156/330 |
| 2012/0055705 | A1* | 3/2012 | White | C07F 9/657172 174/259 |
| 2012/0095170 | A1 | 4/2012 | Kong et al. | |
| 2012/0097437 | A1 | 4/2012 | Liao et al. | |
| 2013/0122308 | A1* | 5/2013 | Wu | C08J 5/24 428/418 |
| 2013/0126217 | A1 | 5/2013 | Yamaguchi et al. | |
| 2013/0161080 | A1* | 6/2013 | Lin | C08L 63/00 174/257 |
| 2014/0249253 | A1 | 9/2014 | Worku et al. | |
| 2014/0322541 | A1* | 10/2014 | Wang | C08K 5/0066 428/418 |
| 2014/0378626 | A1* | 12/2014 | Shen | C08G 8/00 525/507 |
| 2015/0072583 | A1 | 3/2015 | Murata et al. | |
| 2015/0183976 | A1* | 7/2015 | Banda | C08J 3/11 428/195.1 |
| 2015/0344507 | A1* | 12/2015 | Gan | C08L 61/00 558/76 |
| 2016/0024304 | A1* | 1/2016 | You | C08K 5/0066 523/451 |
| 2016/0185953 | A1* | 6/2016 | You | C08K 5/523 523/451 |
| 2016/0244602 | A1* | 8/2016 | You | C08G 59/5073 |
| 2017/0253013 | A1 | 9/2017 | Li et al. | |
| 2017/0253735 | A1* | 9/2017 | Song | C08G 59/621 |
| 2017/0283609 | A1 | 10/2017 | Zeng et al. | |
| 2019/0203123 | A1* | 7/2019 | Liao | B32B 5/024 |
| 2019/0225758 | A1* | 7/2019 | Hirota | C08L 61/06 |
| 2019/0241733 | A1* | 8/2019 | Liao | C08K 3/36 |
| 2019/0367727 | A1* | 12/2019 | Liu | B32B 15/14 |
| 2019/0382556 | A1* | 12/2019 | Liao | C08K 5/357 |
| 2020/0071477 | A1* | 3/2020 | Liu | C08J 5/24 |
| 2020/0181402 | A1* | 6/2020 | Liu | B32B 15/14 |

FOREIGN PATENT DOCUMENTS

| | | | |
|---|---|---|---|
| CN | 103450265 A | * | 12/2013 |
| CN | 103450421 A | * | 12/2013 |
| CN | 103450422 A | * | 12/2013 |
| CN | 103450426 A | * | 12/2013 |
| CN | 103450427 A | * | 12/2013 |
| CN | 103450429 A | | 12/2013 |
| KR | 2017-0080401 A | * | 7/2017 |
| KR | 20170080401 A | | 7/2017 |
| TW | 2008-17469 A | * | 4/2008 |
| TW | 201209095 A1 | | 3/2012 |
| TW | 201352081 A | | 12/2013 |
| WO | 2016074288 A1 | | 5/2016 |
| WO | 2016101540 A1 | | 6/2016 |

OTHER PUBLICATIONS

Taiwanese Office Action dated Jan. 17, 2019.
Chinese Office Action dated Mar. 9, 2021.

* cited by examiner

RESIN COMPOSITION, AND PRE-PREG, METAL-CLAD LAMINATE AND PRINTED CIRCUIT BOARD PREPARED USING THE SAME

CLAIM FOR PRIORITY

This application claims the benefit of Taiwan Patent Application No. 107100199 filed on Jan. 3, 2018, the subject matters of which are incorporated herein in their entirety by reference.

BACKGROUND OF THE INVENTION

Field of the Invention

The present invention provides a resin composition, especially a resin composition comprising a phosphorus-containing phenolic resin modified by 9,10-dihydro-9-oxa-10-phosphaphenanthrene-10-oxide (DOPO) or a DOPO derivative. The resin composition of the present invention can be used in combination with glass fibers to constitute a composite material or prepreg, and furthermore, can be used as a metal foil adhesive to manufacture a metal-clad laminate and a printed circuit board.

Descriptions of the Related Art

In electronic communication, the signals of electronic products must be transmitted in a higher frequency region due to the increasing amount of data transmission and, as a result, the electronic materials applied in the electronic products must have lower dielectric constant (Dk) and dissipation factor (Df) values. Furthermore, to achieve a lead-free and halogen-free environmental process, the dielectric layer of a printed circuit board must be made of lead-free and halogen-free materials, including a non-halogen flame retardant and a halogen-free epoxy resin. However, the electronic material that is prepared by using a resin composition formula satisfying the aforementioned demands does not have all the required properties such as electrical properties, heat resistance, and non-halogen flame retardance.

It is known that a DOPO-modified phenolic resin may be added into an epoxy resin composition as a hardener of epoxy resin to improve flame retardance. For example, US 2007/0221890 A1 discloses a DOPO-modified phenol compound and a DOPO-modified phenolic compound, which belong to a non-halogen flame retardant and are known as DOPO-BN (there are many commercially available products, including the product with a model number 92741 from Dow Chemical). However, the electronic material prepared using such flame retardant has undesired high water absorbance and high Df value and thus has limited application in high frequency material.

US 2012/0095170 A1 also discloses a DOPO-modified phosphorus-containing phenolic resin; however, the DOPO-modified phosphorus-containing phenolic resin has an asymmetric —OH group in structure that will adversely affect the electrical properties of electronic material. Furthermore, according to the disclosure of the US patent, the electronic material prepared using the flame retardant is insufficient in heat resistance (the glass transition temperature (Tg) thereof is too low) and therefore must be used in combination with a general phenolic resin to improve the heat resistance.

WO 2016101540 A1 also discloses a DOPO-modified phosphorus-containing phenolic resin. The DOPO-modified phosphorus-containing phenolic resin includes dicyclopentadiene phenol (DCPD phenol) in structure that has a high steric hindrance and thus, a poor solubility. As a result, a problem in processability occurs.

WO 2016074288 discloses a resin composition comprising a polyphenylene ether resin and an epoxy resin with a DCPD-structure and a (1,1,3,3-tetramethyl)butyl group. However, in addition to the aforementioned solubility problem caused by the DCPD-structure, the resin composition is incapable of providing an electronic material with sufficient flame retardance and therefore, must be used together with another flame retardant.

In view of the above, although modifying a phenolic resin with DOPO is known in the art, there is still a lot to be improved in practical use. In particular, there is a need for a halogen-free resin composition which has excellent physicochemical properties, a low Dk and Df value, and a high glass transition temperature.

SUMMARY OF THE INVENTION

In view of the aforementioned problems, the present invention provides a resin composition formulation, wherein a halogen-free epoxy resin is used in combination with a hardener and a phosphorus-containing phenolic resin with a specific structure. The phosphorus-containing phenolic resin not only provides the resin composition of the present invention and the products thereof with outstanding flame retardance because of its phosphorus moiety, but it also provides outstanding electrical properties, heat resistance, dimensional stability and moisture resistance. As a result, the present invention provides an electronic material with outstanding electrical properties and physicochemical properties.

Therefore, an objective of the present invention is to provide a resin composition, comprising:
(A) a halogen-free epoxy resin
(B) a hardener; and
(C) a phosphorus-containing phenolic resin of formula (I):

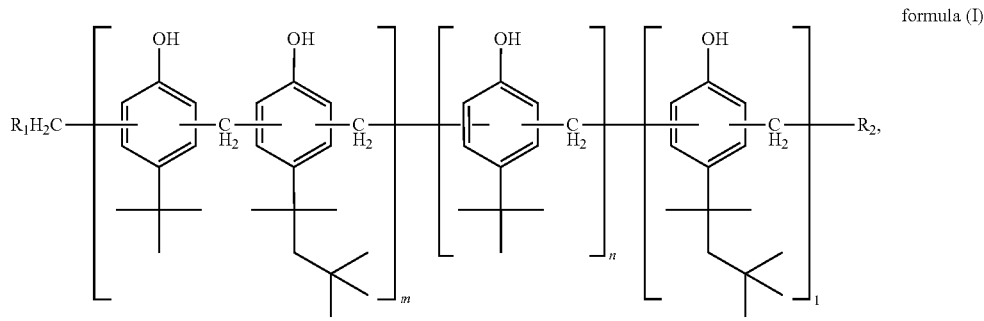

formula (I)

in formula (I), m, n, and l are independently an integer of 0 to 10, with the proviso that at least one of n, m and l is not 0; and $R_1$ and $R_2$ are independently a residue of 9,10-dihydro-9-oxa-10-phosphaphenanthrene-10-oxide (DOPO), a residue of DOPO's derivative, a residue of amino triazine novolac (ATN) resin, or —O(CH$_2$)$_3$CH$_3$, with the proviso that at least one of $R_1$ and $R_2$ is a residue of DOPO or a residue of DOPO's derivative.

In some embodiments of the present invention, $R_1$ and $R_2$ in formula (I) are independently a residue of DOPO, a residue of

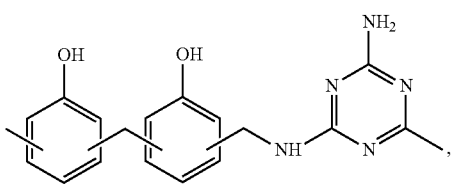

or —O(CH$_2$)$_3$CH$_3$, with the proviso that at least one of $R_1$ and $R_2$ is a residue of DOPO.

In some embodiments of the present invention, the hardener is selected from the group consisting of diaminodiphenyl sulfone (DDS), amino triazine novolac resin (ATN), bismaleimide resin (BMI), polyfunctional maleimide resin, styrene maleic anhydride (SMA), benzoxazine resin, and combinations thereof.

In some embodiments of the present invention, the weight ratio of the hardener (B) to the phosphorus-containing phenolic resin (C) is from about 0.2:1 to about 3:1, and preferably from about 0.3:1 to about 1.5:1.

In some embodiments of the present invention, based on 100 parts by weight of the halogen-free epoxy resin (A), the amount of the hardener (B) is about 5 parts by weight to about 60 parts by weight and the amount of the phosphorus-containing phenolic resin (C) is about 10 parts by weight to about 50 parts by weight.

In some embodiments of the present invention, the resin composition further comprises a co-hardener selected from the group consisting of dicyandiamide (DICY), cyanate ester resin, phenolic resin (PN) other than the phosphorus-containing phenolic resin (C), diaminodiphenylmethane, poly(styrene-co-vinyl phenol), and combinations thereof.

In some embodiments of the present invention, the resin composition further comprises a core/shell rubber.

In some embodiments of the present invention, the resin composition further comprises a component selected from the group consisting of a filler, a flame retardant, a catalyst, a dispersant agent, a toughener, and combinations thereof. The filler may be selected from the group consisting of silicon dioxide (e.g., hollow silicon dioxide), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartzes, diamonds, diamond-like, graphite, calcined kaolin, pryan, mica, hydrotalcite, polytetrafluoroethylene (PTFE) powders, glass beads, ceramic whiskers, carbon nanotubes, nanosized inorganic powders, and combinations thereof.

Another objective of the present invention is to provide a prepreg, which is prepared by impregnating a substrate into the above-mentioned resin composition or by coating the above-mentioned resin composition onto a substrate, and drying the impregnated or coated substrate.

Yet another object of the present invention is to provide a metal-clad laminate, which is prepared from the above-mentioned prepreg, or by directly coating the above-mentioned resin composition onto a metal foil and drying the coated metal foil.

Yet another objective of the present invention is to provide a printed circuit board, which is prepared from the above-mentioned metal-clad laminate.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms.

Unless it is additionally explained, while describing constituents in a solution, mixture or composition in the specification, the amount of each constituent is calculated based on the dry weight, i.e., regardless of the weight of the solvent.

As used herein, the expression "about" suggests that the designated amount may increase or decrease a magnitude that is general and reasonable to persons skilled in the art.

The feature of the present invention lies in that the resin composition of the present invention includes a phosphorus-containing phenolic resin with a specific structure. The nonpolar or low polar alkyl carbon chain in the molecular structure of the phosphorus-containing phenolic resin could improve the electrical properties of the electronic material prepared therefrom. The residue derived from DOPO or a derivative of DOPO at the end of the molecular structure could impart good flame retardance to the electronic material prepared therefrom. The low carbon alkyl or residue derived from amino triazine novolac (ATN) resin at the end of the molecular structure could further improve the electrical properties of the electronic material prepared therefrom and increase the crosslinking density of the resin composition and thus, improve the electrical properties and heat resistance (e.g., Tg) of the electronic material prepared therefrom. The detailed descriptions for each component of the resin composition and the preparation method of the resin composition are provided as follows.

1. RESIN COMPOSITION

The resin composition of the present invention comprises a halogen-free epoxy resin (A), a hardener (B), and a phosphorus-containing phenolic resin (C) with specific structure as essential components and optional components that may be used depending on the need.

1.1. Halogen-Free Epoxy Resin (A)

As used herein, a halogen-free epoxy resin refers to a thermo hardening resin with at least two epoxy functional groups in each molecule, such as a multi-functional epoxy resin, a linear phenolic epoxy resin, or a combination thereof. The multi-functional epoxy resin may be but is not limited to a bifunctional epoxy resin, a tetrafunctional epoxy resin, an octafunctional epoxy resin. Examples of the halogen-free epoxy resin include but are not limited to phenolic epoxy resins, bisphenol epoxy resins, dicyclopentadiene (DCPD-type) epoxy resins, diphenylethylene epoxy resins, triazine skeleton-containing epoxy resins, fluorene skeleton-containing epoxy resins, triphenol methane epoxy resins, biphenyl epoxy resins, xylylene epoxy resins, biphenyl aralkyl epoxy resins, naphthalene epoxy resins, alicyclic epoxy resins, and combinations thereof. Examples of the phenolic epoxy resin include but are not limited to phenol phenolic epoxy resins, cresol phenolic epoxy resins, bisphenol A phenolic epoxy resin and bisphenol F phenolic epoxy resins. Examples of the bisphenol epoxy resin include but are not limited to bisphenol A epoxy resin, bisphenol F epoxy resins and bisphenol S epoxy resins. Examples of the epoxy resin also include diglycidyl ether compounds of multi-ring aromatics such as multi-functional phenols and anthracenes. Furthermore, phosphorus may be introduced into the epoxy resin to provide a phosphorus-containing epoxy resin. An example of the phosphorus-containing epoxy resin is a DOPO-modified epoxy resin.

1.2. Hardener (B)

The hardener has an reactive functional group and can participate in curing reaction to form a network structure, thereby, improving the properties of the electronic material prepared therefrom, such as glass transition temperature (Tg), water absorption, or Df.

In general, in the resin composition of the present invention, based on 100 parts by weight of the halogen-free epoxy resin (A), the amount of the hardener (B) is about 5 parts by weight to about 60 parts by weight, such as 6 parts by weight, 7 parts by weight, 8 parts by weight, 9 parts by weight, 10 parts by weight, 11 parts by weight, 12 parts by weight, 13 parts by weight, 14 parts by weight, 15 parts by weight, 17 parts by weight, 19 parts by weight, 20 parts by weight, 22 parts by weight, 24 parts by weight, 25 parts by weight, 27 parts by weight, 30 parts by weight, 32 parts by weight, 35 parts by weight, 37 parts by weight, 40 parts by weight, 42 parts by weight, 45 parts by weight, 48 parts by weight, 50 parts by weight, 52 parts by weight, 55 parts by weight, or 58 parts by weight, but the present invention is not limited thereto. Persons with ordinary skill in the art could adjust the amount of the hardener (B) depending on the need.

In some embodiments of the present invention, the hardener (B) is selected from the group consisting of diaminodiphenyl sulfone (DDS) resin, amino triazine novolac (ATN) resin, bismaleimide (BMI) resin, polyfunctional maleimide resin, styrene maleic anhydride resin (SMA), benzoxazine resin, and combinations thereof. In the case of using the above-mentioned hardener, the prepared electronic material has better heat resistance (higher glass transition temperature (Tg)). Detailed descriptions for the above-mentioned hardener are provided below.

1.2.1. Diaminodiphenyl Sulfone (DDS) Resin

A diaminodiphenyl sulfone (DDS) resin is an aromatic amine hardener. Examples of the diaminodiphenyl sulfone resin include but are not limited to 3,3'-sulfonyldianiline

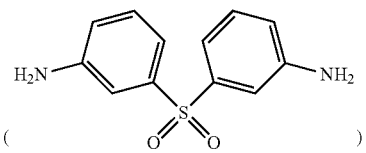 [SMILES: Nc1cccc(S(=O)(=O)c2cccc(N)c2)c1]

and 4,4'-sulfonyldianiline

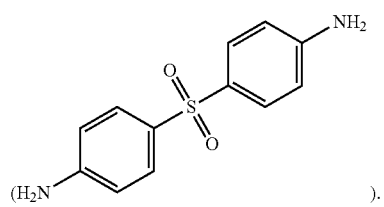

1.2.2. Amino Triazine Novolac (ATN) Resin

An amino triazine novolac (ATN) resin can improve the heat resistance of the prepared electronic material, as well as the adhesion between the dielectric layer and metal foil in a metal-clad laminate. In general, an amino triazine novolac (ATN) resin can be prepared by reacting a phenolic compound, an aldehyde compound and a guanidine compound in the presence of an acid catalyst (e.g., oxalic acid or p-toluenesulfonic acid). Examples of the phenolic compound include phenol, cresol and dimethylphenol. An example of the aldehyde compound is formaldehyde. The guanidine compound can be one or more compounds represented by the following formula:

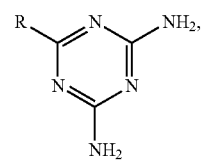

wherein R may be an amino group (melamine), a phenyl group (benzoguanamine), or an alkyl group such as methyl (acetoguanamine).

An example of the amino triazine novolac resin is the compound represented by the following formula:

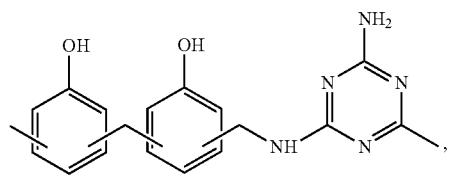

but the present invention is not limited thereto.

1.2.3. Bismaleimide (BMI) Resin

A bismaleimide resin is a compound with two maleimide functional groups. The maleimide functional group has a reactive carbon-carbon double bond and thus can react with other unsaturated functional group to undergo crosslinking and curing and improve the heat resistance of the material obtained after the resin composition is cured. Specifically, the bismaleimide resin can be represented by the following formula:

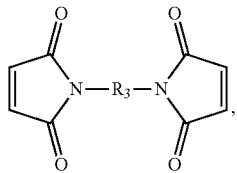

wherein $R_3$ is an organic group, and preferably selected from the group consisting of: methylene (—$CH_2$—), 4,4'-diphenylmethane

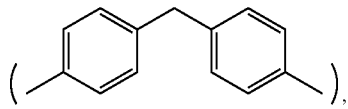

m-phenylene

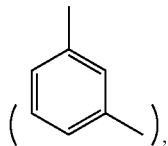

bisphenol A diphenyl ether

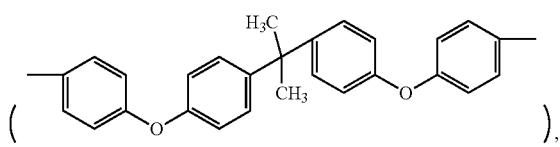

3,3'-dimethyl-5,5'-diethyl-4,4'-diphenylmethane group

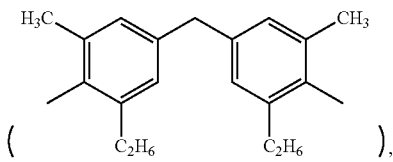

4-methyl-1,3-phenylene

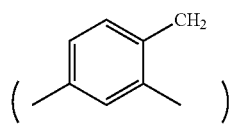

and 2,2',4-trimethylhexylene

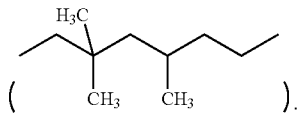

Examples of the bismaleimide resin include but are not limited to 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexyl methane, 3,5-bis(4-maleimidophenyOpyridine, 2,6-bismaleimidopyridine, 1,3-bis(maleimidomethyl)cylcohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenypethane, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether) bismaleimide, N,N'-(4,4'-diphenylsulfone) bismaleimide, N,N'-(4,4'-dicyclohexylmethane) bismaleimide, N,N'-α,α'-4,4'-dimethylene cyclohexane bismaleimide, N,N'-m-dimethylphenylbismaleimide, N,N'-(4,4'-diphenylcyclohexane)bismaleimide and N,N'-methylene bis(3-chloro-p-phenylene) bismaleimide. Commercially available bismaleimide resins include BMI-70 and BMI-80 of KI Chemical company and BMI-1000, BMI-4000, BMI-5000 and BMI-7000 of Daiwa Fine Chemical company. The above-mentioned bismaleimide resins can either be used alone or in any combination depending on the need of persons with ordinary skill in the art. In the appended examples, BMI-70 ($R_3$ is 3,3'-dimethyl-5,5'-diethyl-4,4'-diphenylmethyl) is used.

1.2.4. Polyfunctional Maleimide Resin

As used herein, a polyfunctional maleimide resin refers to an oligomer with a polarity of maleimido functional groups, usually a condensation reaction product from aniline or formaldehyde and maleic anhydride. Specifically, the polyfunctional maleimide resin can be represented by the following formula:

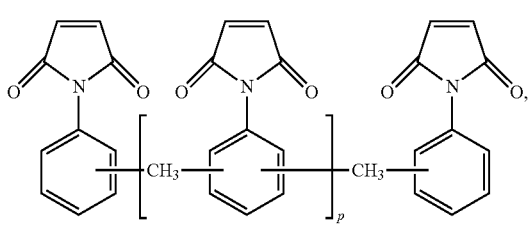

wherein p is integer of 1 to 10.

The detailed description for the polyfunctional maleimide resin can be found in, for example, U.S. Pat. No. 4,435,560. The subject matters of U.S. Pat. No. 4,435,560 is incorporated herein in its entirety by reference. Commercially available polyfunctional bismaleimide resins include BMI-2000 and BMI-2300 (CAS: 67784-74-1) of Daiwa Fine Chemical company.

1.2.5. Styrene Maleic Anhydride (SMA) Resin

A styrene maleic anhydride (SMA) resin is a copolymer of styrene monomer and maleic anhydride monomer and has the effect of lowering Dk and Df of the prepared electronic material. Furthermore, the group derived from maleic anhydride in the molecular is an advantageous group that can react with epoxy resin, and therefore, the styrene maleic anhydride can also improve Tg. Specifically, the styrene maleic anhydride resin may be a polymer with the following repeating unit:

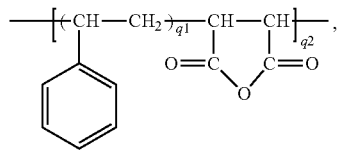

wherein q1 is generally an integer of 1 to 10 and q2 is generally an integer of 10 to 40.

In the styrene maleic anhydride resin, the higher the mole ratio of styrene (i.e., the higher the q1), the lower the Df value and glass transition temperature (Tg) of the prepared electronic material; that is, the electrical properties are better but the Tg is less good (in the case where q1=1, Tg is about 155° C., and in the case where q1=8, Tg is only about 104° C.). Furthermore, an over high mole ratio of styrene (e.g., q1≥8) is not good in terms of processing operation because the surface of the prepared prepreg will become sticky and thus result in self-adhesion of prepared prepregs. Conversely, the lower the mole ratio of styrene (e.g., q1≤3), the higher the Tg of the prepared electronic material, i.e., the better the heat resistance, but the prepared electronic material becomes brittle and therefore, will cause dust pollution during the subsequent processing. In view of the above, q1 in the aforementioned repeating unit is preferably 3 to 8. Examples of the styrene maleic anhydride resins with the required mole ratio of styrene include SMA EF-40 (q1=4) and EF-30 (q1=3) available from Cray Valley company.

1.2.6. Benzoxazine Resin

A benzoxazine resin refers to a chemical substance prepared by a phenolic hydroxy compound, a primary amine and a formaldehyde according to the following reaction:

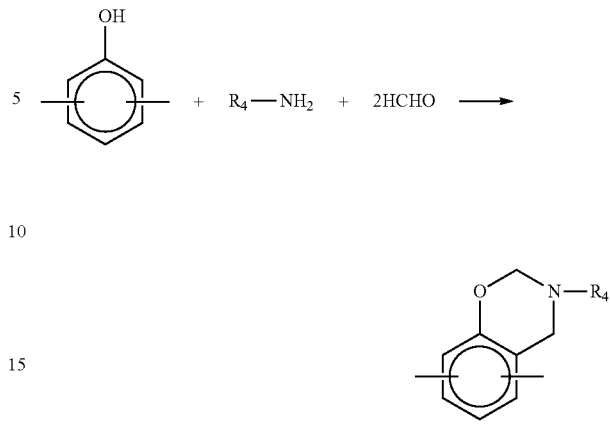

In the above reaction equation, examples of the phenolic hydroxy compound include but are not limited to multifunctional phenol compounds (e.g., catechol, resorcinol, or hydroquinone), biphenol compounds, bisphenol compounds (e.g., bisphenol A, bisphenol F, or bisphenol S), trisphenol compound, and a phenolic resin (e.g., a novolac varnish resin or melamine phenolic resin). The $R_4$ group of the primary amine ($R_4$—$NH_2$) can be an alkyl group, a cycloalkyl group, an un-substituted phenyl group, or an alkyl- or alkoxy-substituted phenyl group. Examples of the primary amine include but are not limited to methylamine and substituted or unsubstituted aniline. Formaldehyde (HCHO) can be provided by formalin or paraformaldehyde.

The benzoxazine resin can be added into the resin composition of the present invention in the form of its prepolymer by conducting a ring-opening polymerization in advance. The preparation and use of such prepolymer can be found in, for example, US 2012/0097437 A1 (Applicant: Taiwan Union Technology Corporation), the subject matters of which is incorporated herein in its entirety by reference.

1.3. Phosphorus-Containing Phenolic Resin (C) Having A Structure of Formula (I)

The resin composition of the present invention comprises a phosphorus-containing phenolic resin (C) which has a structure of formula (I). The phosphorus-containing phenolic resin (C) is modified by DOPO or a DOPO derivative at the end, and has a tert-butyl or (1,1,3,3)-tetramethylbutyl on the ring of the phenol in the phenolic backbone.

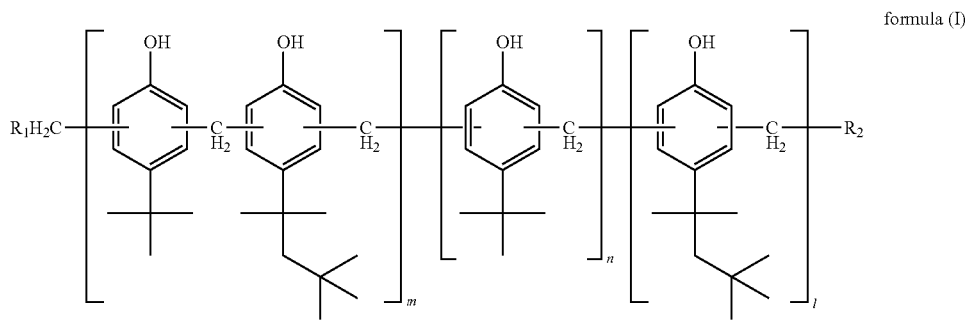

formula (I)

In formula (I), m, m and 1 are independently an integer ranging from 0 to 10, with the proviso that at least one of n, m and 1 is not 0; and $R_1$ and $R_2$ are independently a residue of DOPO, a residue of DOPO's derivative, a residue of amino triazine novolac (ATN) resin, or —O(CH$_2$)$_3$CH$_3$. To impart the flame retardance to the prepared electronic material, at least one of $R_1$ and $R_2$ should be a residue of DOPO or a residue of DOPO's derivative.

In formula (I), the larger the characters m, n and 1, the more the —OH group in the main chain and the better the crosslinking density of the resin composition after being cured. When $R_1$ and $R_2$ are a residue of DOPO or a residue of DOPO's derivative respectively, the phosphorus-containing phenolic resin could impart better flame retardance. When either $R_1$ or $R_2$ is a residue of DOPO or a residue of DOPO's derivative and the other is —O(CH$_2$)$_3$CH$_3$, the phosphorus-containing phenolic resin could provide better electrical properties. When either $R_1$ or $R_2$ is a residue of DOPO or a residue of DOPO's derivative and the other is a residue of ATN, the phosphorus-containing phenolic resin could provide better reactivity.

The preparation method of the above-mentioned phosphorus-containing phenolic resin (C) of the formula (I) is not particularly limited and is not the feature of the present invention. The phosphorus-containing phenolic resin (C) is commercially available and can be prepared by persons having ordinary skill in the art by using a proper method depending on the need based on the disclosure of the present invention. For example, a phenolic resin with the backbone structure of the formula (I) can be prepared in advance by using a conventional method, and then, the ends of prepared phenolic resin can be modified by using DOPO, DOPO's derivative or ATN to provide the phosphorus-containing phenolic resin (C) of the formula (I). The modifying method can be found in, for example, US 2007/0221890, U.S. Pat. No. 8,124,716 and US 2014/0249253, and the subject matters of each of which is incorporated herein in its entirety by reference. In the appended examples, the phosphorus-containing phenolic resin (C) of the formula (I) is KEG3320B65 available from Kolon Industries, wherein $R_1$ and $R_2$ in formula (I) are independently a residue of DOPO, a residue of

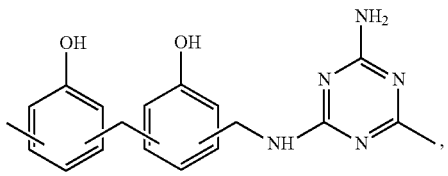

or —O(CH$_2$)$_3$CH$_3$. The phosphorus-containing phenolic resin (C) of the formula (I) is also available from Dow Chemical Company.

In the resin composition of the present invention, based on 100 parts by weight of the halogen-free epoxy resin (A), the amount of the phosphorus-containing phenolic resin (C) is about 10 parts by weight to about 50 parts by weight, such as 11 parts by weight, 12 parts by weight, 13 parts by weight, 14 parts by weight, 15 parts by weight, 17 parts by weight, 19 parts by weight, 20 parts by weight, 22 parts by weight, 24 parts by weight, 25 parts by weight, 27 parts by weight, 30 parts by weight, 32 parts by weight, 35 parts by weight, 37 parts by weight, 40 parts by weight or 45 parts by weight.

In the resin composition of the present invention, the weight ratio of the hardener (B) to the phosphorus-containing phenolic resin (C) is from about 0.2:1 to about 3:1, and preferably about 0.3:1 to about 1.5:1, such as 0.36:1, 0.37:1, 1.4:1, 0.5:1, 0.55:1, 0.6:1, 0.65:1, 0.7:1, 0.75:1, 0.8:1, 0.85:1, 0.9:1, 1:1, 1.05:1, 1.1:1, 1.15:1, 1.2:1, 1.25:1, 1.3:1, 1.35:1, 1.4:1 or 1.45:1.

1.4. Optional Components

The resin composition of the present invention may optionally further comprise other ingredients, such as the following co-hardener, core/shell rubber and additives well-known to persons having ordinary skill in the art, to improve the physico-chemical properties of the prepared electronic material or the workability of the resin composition during manufacturing.

1.4.1. Co-Hardener

The resin composition of the present invention may comprise, in addition to the hardener (B), a known hardener that is suitable for epoxy resin, such as a —OH group-containing compound, an amino-containing compound, an anhydride compound, or an active ester compound. The amount of the co-hardener is not particularly limited and can be adjusted by persons with ordinary skill in the art depending on the need. Examples of the co-hardener include but are not limited to dicyandiamide (DICY), cyanate ester resin, phenolic resin (PN), diaminodiphenylmethane and poly(styrene-co-vinyl phenol). The aforementioned hardeners can either be used alone or in combination. In the appended examples, dicyandiamide (DICY) is used.

1.4.2. Core/Shell Rubber

The resin composition of the present invention may further comprise a core/shell rubber as a toughener to improve the brittleness of the prepared electronic material and thus make the electronic material tough. As used herein, the core/shell rubber refers to a rubber with a double layer structure. The double layer structure include a core layer (inner layer) and a shell layer (outer layer) covering the core layer. The core layer is usually composed of diene elastomer or siloxane; the main function of which is to absorb stress. The shell layer is usually composed of a polymer with high compatibility with other components of the resin composition. For example, the shell layer may be a polymer or copolymer formed from one or more of an acrylic monomer, a methacrylic monomer, a styrene monomer, and an acrylonitrile monomer. The main function of the shell layer is to envelope the surface of the core layer, thereby, facilitating the compatibility between the core/shell rubber and the resin composition, and making the core/shell rubber well dispersed in the resin composition.

The core/shell rubber can be prepared by any preparing method known to persons with ordinary skill in the art. For example, the core/shell rubber can be prepared by using the method disclosed in US 2009/0298970, the subject matters of which is incorporated herein in its entirety by reference. Examples of commercially available core/shell rubber include MX-120, MX-125, MX-130, MX-156, and MX-551 available from KANEKA company, KANE ACE series products also available from KANEKA company, and METABLEN SX-006 available from Mitsubishi Rayon company.

In general, to provide the desired effect on toughness without affecting the characteristic properties of the resin composition, based on the dry weight of the resin composition, the content of the core/shell rubber usually ranges from about 1 wt % to about 20 wt %, such as 2 wt %, 4 wt %, 4.5 wt %, 6 wt %, 7 wt %, 8 wt %, 8.5 wt %, 9 wt %, 10 wt %, 12 wt %, 13 wt %, 14 wt %, 16 wt %, 17 wt %, 18 wt % or 19 wt %, preferably from about 1 wt % to about 15 wt %, and more preferably from about 1 wt % to about 5 wt %, but the present invention is not limited thereto.

1.4.3. Other Additives

Examples of the additive that can be used in the resin composition of the present invention include but are not limited to a filler, a flame retardant, a catalyst, a dispersing agent, and a toughener. The additives can either be used alone or in combination.

In some embodiments of the present invention, the resin composition further comprises a filler to improve the physico-chemical properties of the prepared electronic material. Examples of the filler include but are not limited to silicon dioxide (e.g., hollow silicon dioxide), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartzes, diamonds, diamond-like, graphite, calcined kaolin, pryan, mica, hydrotalcite, polytetrafluoroethylene (PTFE) powders, glass beads, ceramic whiskers, carbon nanotubes and nanosized inorganic powders. The additives can be used alone or in combination. In general, based on the dry weight of the resin composition, the amount of the filler may range from 0 wt % to about 40 wt %, such as 1 wt %, 3 wt %, 5 wt %, 7 wt %, 10 wt %, 15 wt %, 20 wt %, 22 wt %, 25 wt %, 30 wt %, or 35 wt %, but, the present invention is not limited thereto. The amount of the filler can be adjusted depending on the need of persons with ordinary skill in the art.

In some embodiments of the present invention, the resin composition further comprises a catalyst that promotes the reaction of epoxy functional groups and lowers the curing reaction temperature of the resin composition. The species of the catalyst is not particularly limited as long as it can promote the ring-opening reaction of epoxy functional groups and lower the curing reaction temperature. For example, the catalyst can be a tertiary amine, a quaternary ammonium salt, a imidazole compound, or a pyridine compound, and each of the aforementioned catalyst can either be used alone or in combination. Examples of the catalyst include, but are not limited to, 2-methylimidazole, 2-ethyl-4-methylimidazole, 2-phenylimidazole, dimethylbenzylamine, 2-dimethylaminomethylphenol, 2,4,6-tris(dimethylaminomethyl)phenol, 2,3-diaminopyridine, 2,5-diaminopyridine, 2,6-diaminopyridine, 4-dimethylaminopyridine, 2-amino-3-methylpyridine, 2-amino-4-methylpyridine, and 2-amino-3-nitropyridine. In general, based on the dry weight of the resin composition, the amount of the catalyst may range from about 0.5 wt % to about 5 wt %, such as 1 wt %, 1.5 wt %, 2 wt %, 2.5 wt %, 3 wt %, 3.5 wt %, 4 wt %, or 4.5 wt %, but the present invention is not limited thereto. The amount of the catalyst can be adjusted depending on the need of persons with ordinary skill in the art.

1.5. Preparation of Resin Composition

The resin composition of the present invention may be prepared into a varnish for subsequent applications by evenly mixing the halogen-free epoxy resin, the hardener, the phosphorus-containing phenolic resin of formula (I) and other optional components through a stirrer and dissolving or dispersing the obtained mixture into a solvent. The solvent here can be any inert solvent that can dissolve or disperse the components of the resin composition of the present invention but does not react with the components of the resin composition. Examples of the solvent that can dissolve or disperse the components of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). The solvents can either be used alone or in combination. The amount of the solvent is not particularly limited as long as the components of the resin composition can be evenly dissolved or dispersed therein. In some embodiments of the present invention, a mixture of toluene, methyl ethyl ketone and γ-butyrolactone is used as the solvent.

2. PREPREG

The present invention also provides a prepreg prepared from the above-mentioned resin composition, wherein the prepreg is prepared by impregnating a substrate with the above-mentioned resin composition or by coating the above-mentioned resin composition onto a substrate and drying the impregnated or coated substrate. Examples of the substrate include but are not limited to glass fiber reinforcing material (e.g., glass-fiber woven fabrics or non-woven fabrics, glass papers, or glass mats), kraft papers, short fiber cotton papers, nature fiber cloths, and organic fiber cloths (e.g., cloths of liquid crystal polymer fiber). In some embodiments of the present invention, 2116 glass fiber cloth are used as the substrate, and the substrate is heated and dried at 175° C. for 2 to 15 minutes (B-stage) to provide a semi-cured prepreg.

3. METAL-CLAD LAMINATE AND PRINTED CIRCUIT BOARD

The present invention also provides a metal-clad laminate prepared from the abovementioned resin composition or prepreg. The metal-clad laminate comprises a dielectric layer and a metal layer. The dielectric layer is provided by the abovementioned prepreg or just the cured product of the resin composition. Specifically, the metal-clad laminate can be prepared by superimposing a plurality of prepregs and superimposing a metal foil (such as a copper foil) on at least one external surface of the dielectric layer composed of the superimposed prepregs to provide a superimposed object, and performing a hot-pressing operation onto the superimposed object to obtain the metal-clad laminate. Alternatively, the metal-clad laminate can be prepared by directly coating the resin composition onto a metal foil and drying the coated metal foil to obtain the metal-clad laminate. Furthermore, a printed circuit board can be prepared by patterning the external metal foil of the metal-clad laminate.

4. EXAMPLES

4.1. Testing Method

The present invention is further illustrated by the embodiments hereinafter, wherein the testing instruments and methods are respectively as follows:

Water Absorption Test

The moisture resistance of the metal-clad laminate is tested by a pressure cooker test (PCT), i.e., subjecting the metal-clad laminate into a pressure container (121° C., saturated relative humidity (100% R.H.) and 1.2 atm) for 2 hours.

Solder Resistance Test

The solder resistance test is carried out by immersing the dried metal-clad laminate in a solder bath at 288° C. for a certain period and observing whether there is any defect such as delamination or blistering.

Peeling Strength Test

The peeling strength refers to the bonding strength between the metal foil and hot-pressed laminated prepreg and is expressed by the force required for vertically peeling the clad copper foil with a width of ⅛ inch from the surface of the hot-pressed laminated prepreg.

Glass Transition Temperature (Tg) Test

The glass transition temperature (Tg) is measured by using a Differential Scanning Calorimeter (DSC), wherein the measuring methods are IPC-TM-650.2.4.25C and 24C testing method of the Institute for Interconnecting and Packaging Electronic Circuits (IPC).

Coefficient of Thermal Expansion (CTE) Test

The coefficient of thermal expansion (CTE) of the sample (a metal-clad laminate in a size of 3 mm$^2$) in thickness direction (i.e., z-axis direction) is tested by the thermal expansion analyzer of TA instrument company (model No.: TA 2940) between a temperature gap ranging from 50° C. to 260° C. (heating rate: 10° C./min).

Flame Retardance Test

The flame retardance test is carried out according to UL94V (Vertical Burn), which comprises the burning of a laminate, which is held vertically, using a Bunsen burner to compare its self-extinguishing properties and combustion-supporting properties. The ranking for the flame retardance level is V0>V1>V2.

Dielectric Constant (Dk) And Dissipation Factor (Df) Measurement

The dielectric constant (Dk) and dissipation factor (Df) are measured according to ASTM D150 under an operating frequency of 10 GHz. The resin content (RC) of the tested prepreg is about 53%.

Alkali Resistance Test

The alkali resistance test is carried out by impregnating a laminate without a copper foil (i.e., a laminate composed of superimposed and hot-pressed prepreg of the present invention) into an NaOH solution with a concentration of 20% by weight at 90° C. for 10 minutes. Thereafter, the appearance of the laminate is observed to see if there is any erosion. If no erosion is observed, the test result is recorded as "Pass", and if any erosion is observed, the test result is recorded as "Fail".

Drill Wear Test

The drill wear is tested by repeatedly drilling the metal-clad laminate by using a drill with a diameter of 0.3 mm for 2000 times, and then observing the wear of the drill top surface. Since the cutting edge (CE) of the drill is continuously in contact with the metal-clad laminate and worn, the cutting corner (CC) of the cutting edge CE will be worn. In this test, unworn percentage of drill is obtained by measuring the length of chisel edge of the cutting corner CC.

4.2. Raw Material List

| Model No. | Description |
|---|---|
| BNE-210 | Epoxy resin, available from Chang Chun (CCP) Company |
| BEP-280 | Epoxy resin, available from Chang Chun (CCP) Company |
| EP-40 | SMA hardener, available from Cray Valley Company |
| DDS | DDS hardener, available from ATUL Company |
| BZ | Benzoxazine hardener, available from Huntsman Company |
| BMI-70 | BMI hardener, available from KI-Chemical Company |
| ATN 7054 | ATN hardener, available from DIC Company |
| 8110 | Phenolic hardener, available from Chang Chun (CCP) Company |
| DICY | DICY co-hardener, available from Degussa Company |
| 525 ARI | Filler, available from Sibelco Company |
| SPB-100 | Flame retardant, available from Otsuka Chemical Company |
| 92741 | DOPO-modified phenolic resin, available from Dow Chemical Company |
| KEG3320B65 | Phosphorus-containing phenolic resin of formula (I), available from Kolon Company |
| 2E4MZ | 2-ethyl-4-methylimidazole (catalyst), available from Union Chemical Company |
| 3328 | Zinc oxide (catalyst), available from the Shepherd Chemical Company |

4.3. Preparation of Resin Composition

The resin compositions of Examples 1 to 7 and Comparative Examples 1 to 3 were prepared according to the constitutions shown in Table 1. In detail, the components were mixed under room temperature with a stirrer, thereafter toluene, methyl ethyl ketone, and γ-butyrolactone (all available from Fluka Company) as solvent were added thereinto. After stirring the resultant mixture under room temperature for 60 to 120 minutes, the resin compositions were obtained.

TABLE 1

| Unit: Parts by weight | | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|---|
| Halogen-free epoxy resin (A) | BNE-210 | 255 | 255 | 200 | 255 | 255 | 255 | 255 | 255 | 255 | 255 |
| | BEP-280 | | | 55 | | | | | | | |

TABLE 1-continued

| Unit:<br>Parts by weight | | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|---|
| Hardener (B) | EF-40 | | | | 90 | 90 | | | | | |
| | DDS | 25 | | 25 | | | | | 25 | 25 | 25 |
| | BZ | | | | | 40 | | | | | |
| | BMI-70 | | 80 | | 40 | | | | | 80 | |
| | ATN 7054 | | | | | | 60 | | | | |
| | 8110 | | | | | | 60 | | | | |
| Co-hardener | DICY | 1 | | | | | | | 1 | | |
| Filler | 525ARI | 160 | 190 | 160 | 200 | 200 | 200 | 160 | 160 | 190 | 160 |
| Flame retardant | SPB-100 | | | | | | | 50 | | | 50 |
| DOPO-modified phosphorus-containing phenolic resin | 92741 | | | | | | | | 100 | 130 | 50 |
| Phosphorus-containing Phenolic resin of formula (I) | KEG3320B65 | 100 | 130 | 110 | 150 | 150 | 150 | 50 | | | |
| Catalyst | 2E4MZ | 0.9 | 0.2 | 0.8 | 0.05 | 0.04 | 0.05 | 0.8 | 1.3 | 1.0 | 1.2 |
| Metal catalyst | 3328 | | 0.2 | | 0.05 | | | | | 0.2 | |

4.4. Preparation and Properties of Metal-Clad Laminate

The metal-clad laminates of Examples 1 to 7 and Comparative Examples 1 to 3 were respectively prepared by using the prepared resin compositions. In detail, one of the resin compositions of Examples 1 to 7 and Comparative Examples 1 to 3 was coated on glass fiber cloths (type: 2116; thickness: 0.08 mm) by a roller with a controlled thickness. The coated glass fiber cloths were then placed in an oven and dried at 175° C. for 2 to 15 minutes to produce prepregs in a half-cured state (B-stage) (the resin content of the prepreg was about 53%). Four pieces of the prepregs were superimposed and two sheets of copper foil (0.5 oz.) were respectively superimposed on both of the two external surfaces of the superimposed prepregs to provide a superimposed object. A hot-pressing operation was performed on each of the prepared objects. The hot-pressing conditions were as follows: raising the temperature to about 200° C. to 220° C. with a heating rate of 3.0° C./min, and hot-pressing for 180 minutes under a full pressure of 15 kg/cm² (initial pressure is 8 kg/cm²) at said temperature.

The properties of the prepregs and metal-clad laminates of Examples 1 to 7 and Comparative Examples 1 to 3, including water absorption, solder resistance, peeling strength, glass transition temperature (Tg), coefficient of thermal expansion, flame retardance level, dielectric constant (Dk), dissipation factor (Df), alkali resistance and drill wear %, were measured according to the aforementioned testing methods, and the results are tabulated in Table 2.

TABLE 2

| Unit:<br>Parts by weight | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|
| Water absorption (%) | 0.17 | 0.11 | 0.17 | 0.09 | 0.07 | 0.17 | 0.17 | 0.29 | 0.21 | 0.20 |
| Solder resistance (min) | >10 | >10 | >10 | >10 | >10 | >10 | >10 | >10 | >10 | >10 |
| Peeling strength (lb/inch) | 5.2 | 4.6 | 5.2 | 4.2 | 4.7 | 4.8 | 4.9 | 5.2 | 4.5 | 4.9 |
| DSC Tg (° C.) | 190 | 202 | 189 | 182 | 183 | 182 | 180 | 185 | 191 | 178 |
| Coefficient of thermal expansion (CTE %) | 2.2 | 1.8 | 2.2 | 2.4 | 2.4 | 2.5 | 2.5 | 2.4 | 2.3 | 2.6 |
| Flame retardance (UL-94) | V0 | V0 | V0 | V0 | V0 | V0 | V0 | V0 | V0 | V0 |
| Dk @10 GHz | 3.85 | 3.62 | 3.81 | 3.55 | 3.75 | 3.85 | 3.85 | 3.85 | 3.6 | 3.6 |
| Df @10 GHz | 0.015 | 0.009 | 0.015 | 0.0079 | 0.0085 | 0.018 | 0.015 | 0.021 | 0.014 | 0.019 |
| Alkali resistance | Pass | Pass | Pass | Pass | Pass | Pass | Pass | Pass | Pass | Pass |
| Drill wear % | 41% | 55% | 45% | 50% | 47% | 55% | 40% | 65% | 68% | 60% |

As shown in Table 2, each of the electronic material prepared from the resin composition of the present invention is provided with satisfactory physicochemical properties, and in particular, the electronic material prepared from the resin composition of the present invention is provided with outstanding water absorption, heat resistance, electrical properties and workability (drill wear %). Specifically, the comparisons between Example 1 and Comparative Example 1, Example 2 and Comparative Example 2, and Example 7 and Comparative Example 3 all manifest that the present invention using the phosphorus-containing phenolic resin of the formula (I) rather than other DOPO-modified phosphorus-containing phenolic resin can obtain an electronic material with lower water absorption, coefficient of thermal expansion, dissipation factor (Df) and drill wear %, and better heat resistance (higher Tg).

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:
(A) a halogen-free epoxy resin;
(B) a hardener; and
(C) a phosphorus-containing phenolic resin of formula (I):

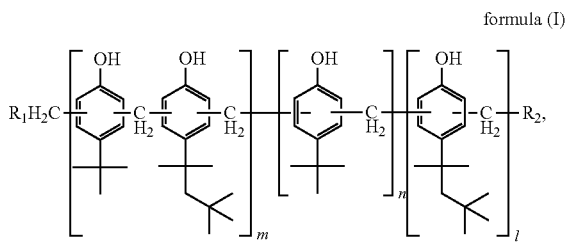

formula (I)

in formula (I),
n is 0, m is 0, and l is an integer of 1 to 10; and
$R_1$ and $R_2$ are independently a residue of 9,10-dihydro-9-oxa-10-phosphaphenanthrene-10-oxide (DOPO), a residue of DOPO's derivative, a residue of amino triazine novolac (ATN) resin, or —O(CH$_2$)$_3$CH$_3$, with the proviso that at least one of $R_1$ and $R_2$ is a residue of DOPO or a residue of DOPO's derivative,
wherein the weight ratio of the hardener (B) to the phosphorus-containing phenolic resin (C) is from about 0.2:1 to about 0.9:1, and
wherein based on 100 parts by weight of the halogen-free epoxy resin (A), the amount of the hardener (B) is about 9 parts by weight to about 52 parts by weight and the amount of the phosphorus-containing phenolic resin (C) is about 19 parts by weight to about 50 parts by weight.

2. The resin composition of claim 1, wherein in formula (I), $R_1$ and $R_2$ are independently a residue of DOPO, a residue of

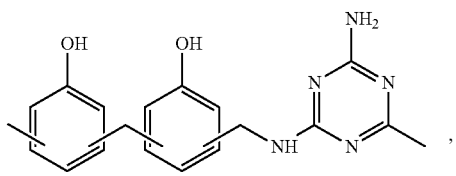

or —O(CH$_2$)$_3$CH$_3$, with the proviso that at least one of $R_1$ and $R_2$ is a residue of DOPO.

3. The resin composition of claim 2, further comprising a co-hardener selected from the group consisting of dicyandiamide (DICY), cyanate ester resin, phenolic resin (PN) other than the phosphorus-containing phenolic resin (C), diaminodiphenylmethane, poly(styrene-co-vinyl phenol), and combinations thereof.

4. The resin composition of claim 2, further comprising a core/shell rubber.

5. The resin composition of claim 1, wherein the hardener is selected from the group consisting of diaminodiphenyl sulfone (DDS), amino triazine novolac resin (ATN), bismaleimide resin (BMI), polyfunctional maleimide resin, styrene maleic anhydride (SMA), benzoxazine resin, and combinations thereof.

6. The resin composition of claim 5, further comprising a co-hardener selected from the group consisting of dicyandiamide (DICY), cyanate ester resin, phenolic resin (PN) other than the phosphorus-containing phenolic resin (C), diaminodiphenylmethane, poly(styrene-co-vinyl phenol), and combinations thereof.

7. The resin composition of claim 5, further comprising a core/shell rubber.

8. The resin composition of claim 1, wherein the weight ratio of the hardener (B) to the phosphorus-containing phenolic resin (C) is from about 0.3:1 to about 0.9:1.

9. The resin composition of claim 1, further comprising a co-hardener selected from the group consisting of dicyandiamide (DICY), cyanate ester resin, phenolic resin (PN) other than the phosphorus-containing phenolic resin (C), diaminodiphenylmethane, poly(styrene-co-vinyl phenol), and combinations thereof.

10. The resin composition of claim 1, further comprising a core/shell rubber.

11. The resin composition of claim 1, further comprising a component selected from the group consisting of a filler, a flame retardant, a catalyst, a dispersant agent, a toughener, and combinations thereof.

12. The resin composition of claim 11, wherein the filler is selected from the group consisting of silicon dioxide, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartzes, diamonds, diamond-like, graphite, calcined kaolin, pryan, mica, hydrotalcite, polytetrafluoroethylene (PTFE) powders, glass beads, ceramic whiskers, carbon nanotubes, nanosized inorganic powders, and combinations thereof.

13. A prepreg, which is prepared by impregnating a substrate with the resin composition of claim 1 or by coating the resin composition of claim 1 onto a substrate and drying the impregnated or coated substrate.

14. A metal-clad laminate, which is prepared by laminating the prepreg of claim 13 and a metal foil.

15. A printed circuit board, which is prepared from the metal-clad laminate of claim 14.

16. A metal-clad laminate, which is prepared by coating the resin composition of claim 1 onto a metal foil and drying the coated metal foil.

17. A printed circuit board, which is prepared from the metal-clad laminate of claim 16.

* * * * *